(12) United States Patent
Nakajima

(10) Patent No.: US 6,531,030 B1
(45) Date of Patent: Mar. 11, 2003

(54) INDUCTIVELY COUPLED PLASMA ETCHING APPARATUS

(75) Inventor: Shu Nakajima, Kanagawa-ken (JP)

(73) Assignee: Lam Research Corp., Fremont, CA (US)

( * ) Notice: Subject to any disclaimer, the term of this patent is extended or adjusted under 35 U.S.C. 154(b) by 0 days.

(21) Appl. No.: 09/608,883

(22) Filed: Jun. 30, 2000

(30) Foreign Application Priority Data

Mar. 31, 2000 (JP) ........................................ 2000-099728

(51) Int. Cl.[7] ......................................... H01L 21/3065
(52) U.S. Cl. ............................ 156/345.48; 156/345.51; 118/723 I; 118/723 R
(58) Field of Search ....................... 156/345; 118/723 I; 438/725

(56) References Cited

U.S. PATENT DOCUMENTS

| | | | | |
|---|---|---|---|---|
| 5,534,231 A | | 7/1996 | Savas | 216/67 |
| 5,540,800 A | | 7/1996 | Qian | 118/723 I |
| 5,650,032 A | | 7/1997 | Keller et al. | 118/723 I |
| 5,824,604 A | * | 10/1998 | Bar-Gadda | 438/725 |
| 6,077,384 A | * | 6/2000 | Collins et al. | 156/345 |
| 6,361,644 B1 | * | 6/2000 | Collins et al. | 118/723 I |
| 6,149,760 A | * | 11/2000 | Hama | 156/345 |
| 6,245,202 B1 | * | 6/2001 | Edamura et al. | 118/723 AN |
| 6,280,563 B1 | * | 8/2001 | Baldwin, Jr. et al. | 156/345 |
| 6,287,435 B1 | * | 9/2001 | Drewery et al. | 204/298.06 |
| 6,308,654 B1 | * | 10/2001 | Schneider et al. | 156/345.37 |
| 6,422,173 B1 | * | 7/2002 | Nakajima | 118/723 AN |

FOREIGN PATENT DOCUMENTS

| | | | | |
|---|---|---|---|---|
| WO | WO 99/34399 | * | 8/1999 | H01J/37/32 |
| WO | WO 99 53733 | | 10/1999 | |

OTHER PUBLICATIONS

Abstract of Japanese Patent Publication 11–251303, Patent Abstracts of Japan, vol. 1999, No. 14, Dec. 22, 1999.

* cited by examiner

Primary Examiner—Jeffrie R. Lund
Assistant Examiner—Rudy Zervigon
(74) Attorney, Agent, or Firm—Martine & Penilla, LLP

(57) ABSTRACT

An inductively coupled plasma etching apparatus includes a chamber for generating a plasma therein. The chamber is defined by walls of a housing. A coil for receiving high frequency (RF) power is disposed adjacent to and outside of one of the walls of the housing. A metal plate is disposed adjacent to and outside of the wall of the housing that the coil is disposed adjacent to. The metal plate is positioned in a spaced apart relationship between the coil and the wall of the housing and has radial slits formed therein that extend transversely to the coil. A connector electrically connects the metal plate to the coil. A method for controlling an inner surface of a wall defining a chamber in which a plasma is generated is also described.

16 Claims, 4 Drawing Sheets

US 6,531,030 B1

INDUCTIVELY COUPLED PLASMA ETCHING APPARATUS

BACKGROUND OF THE INVENTION

The present invention relates generally to semiconductor fabrication and, more particularly, to an inductively coupled plasma etching apparatus and a method for controlling a chamber inner wall surface of an inductively coupled plasma etching apparatus.

In semiconductor manufacturing processes, etching processes, insulation film formation, and diffusion processes are repeatedly carried out. As is well known to those skilled in the art, there are two types of etching processes: wet etching and dry etching. Dry etching is typically implemented by using an inductively coupled plasma etching apparatus such as shown in FIG. 1.

In the inductively coupled plasma etching apparatus shown in FIG. 1, a reactant gas is first led into chamber 400 through a gas lead-in port (not shown). High frequency power is then applied from a power supply (not shown) to coil 407. Semiconductor wafer 411 is mounted on chuck 409 provided inside chamber 400. Coil 407 is held on the upper portion of the chamber by spacers 403, which are formed of an insulating material. In operation, high frequency (RF) current passing through coil 407 induces an electromagnetic current into chamber 400, and the electromagnetic current acts on the reactant gas to generate a plasma.

The plasma contains various types of radicals and the chemical reaction of the positive/negative ions is used to etch semiconductor wafer 411 itself or an insulation film formed on the wafer. During the etching process, coil 407 carries out a function that corresponds to that of the primary coil of a transformer while the plasma in chamber 400 carries out a function that corresponds to that of the secondary coil of the transformer. The reaction product generated by the etching process is discarded via exhaust port 405.

When etching one of the recently developed device materials (e.g., platinum, ruthenium, and the like), the reaction product generated may be a nonvolatile substance (e.g., $RuO_2$). In some cases, the reaction product may adhere to wall 401 of chamber 400. If the reaction product is conductive, then the film of reaction product on wall 401 may electrically shield the electromagnetic current in the chamber. Consequently, the plasma does not strike after several wafers are etched and the etching process must be discontinued.

To avoid this problem, a method for sputtering the reaction product adhered to wall 401 by using the plasma has been developed. In the inductively coupled plasma etching apparatus shown in FIG. 1, however, the electromagnetic current induced by the RF current generates a distribution voltage having a standing wave in the vicinity of wall 401. This is problematic because it causes the deposition and sputtering of the reaction product to become non-uniform. In particular, a relatively large amount of energy is added to the plasma in the region where the amplitude of the standing wave is high. Consequently, the reaction product is excessively sputtered in this region. On the other hand, only a relatively small amount of energy is added to the plasma in the region where the amplitude of the standing wave is low, i.e., the region in the vicinity of the node of the standing wave. As a result, the reaction product is deposited in this region. As discussed above, the presence of an electrically conductive film on wall 401 is undesirable because it can electrically shield the electromagnetic current in the chamber and thereby disable the etching process.

In view of the foregoing, there is a need for an inductively coupled plasma etching apparatus that prevents substantial deposition of electrically conductive reaction products on the surface of a chamber inner wall.

SUMMARY OF THE INVENTION

Broadly speaking, the present invention provides an inductively coupled plasma etching apparatus that uniformly adds energy to the plasma in the vicinity of a wall of the chamber in which the plasma is generated.

In accordance with one aspect of the present invention, an inductively coupled plasma etching apparatus is provided. This apparatus includes a chamber for generating a plasma therein. The chamber is defined by walls of a housing. A coil for receiving high frequency (RF) power is disposed adjacent to and outside of one of the walls of the housing. A metal plate, which acts as a Faraday shield, is disposed adjacent to and outside of the wall of the housing that the coil is disposed adjacent to. The metal plate is positioned in a spaced apart relationship between the coil and the wall of the housing and has radial slits formed therein that extend transversely to the coil. A connector electrically connects the metal plate to the coil.

In one embodiment, a chuck for holding a semiconductor wafer is disposed proximate to a lower wall of the housing, and the metal plate is disposed along a surface of an upper wall of the housing. In one embodiment, the metal plate is substantially parallel to the upper wall of the housing. The metal plate preferably has a thickness in a range from about 20 $\mu$m to about 10 mm, and more preferably has a thickness in a range from about 50 $\mu$m to about 5 mm. In one embodiment, the metal plate has a thickness of about 1.5 mm. The connector electrically connects the metal plate to either a predetermined position of the coil or a conductor extending from an impedance matching box to the coil.

In one embodiment, the coil for receiving high frequency (RF) power disposed adjacent to and outside of the upper wall of the housing. In this embodiment, the metal plate is disposed adjacent to and outside of the upper wall of the housing and is positioned in a spaced apart relationship between the coil and the upper wall of the housing.

In one embodiment, the metal plate is secured to an underside of an attachment frame, which includes attachment spacers on a top side thereof In one embodiment, the coil is positioned between the top side of the attachment frame and a coil mounting plate, which is secured to the attachment spacers. In this embodiment, a U-shaped spacer positions the coil mounting plate, the coil, and the metal plate, and the connector electrically connects the metal plate to the coil through the U-shaped spacer.

In accordance with another aspect of the present invention, a method for controlling an inner surface of a wall defining a chamber in which a plasma is generated in an inductively coupled plasma etching apparatus is provided. In this method, a metal plate is provided between a coil for receiving high frequency (RF) power and the plasma generated in the chamber such that the metal plate does not contact the coil. The metal plate has a plurality of metal slits formed therein that extend transversely to the coil and is electrically connected to the coil. A plasma etching operation is conducted in the inductively coupled plasma etching apparatus. During the plasma etching operation, the deposition of a reaction product on an inner surface of a wall positioned between the metal plate and the plasma and the sputtering of the reaction product from the inner surface of the wall are substantially uniform so that an amount of the reaction product sufficient to disable the plasma etching operation does not accumulate on the inner surface of the wall. In one embodiment, the wall positioned between the metal plate and the plasma is an upper wall of the chamber.

The present invention advantageously prevents the deposition of electrically conductive reaction products, e.g., $RuO_2$, on the inner surface of the wall of a chamber in an inductively coupled plasma etching apparatus. This makes it possible to plasma etch recently developed device materials, e.g., Ru, without having to stop the plasma etching operation to clean the walls of the chamber after only a few wafers have been processed.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE INVENTION

Figure 1:
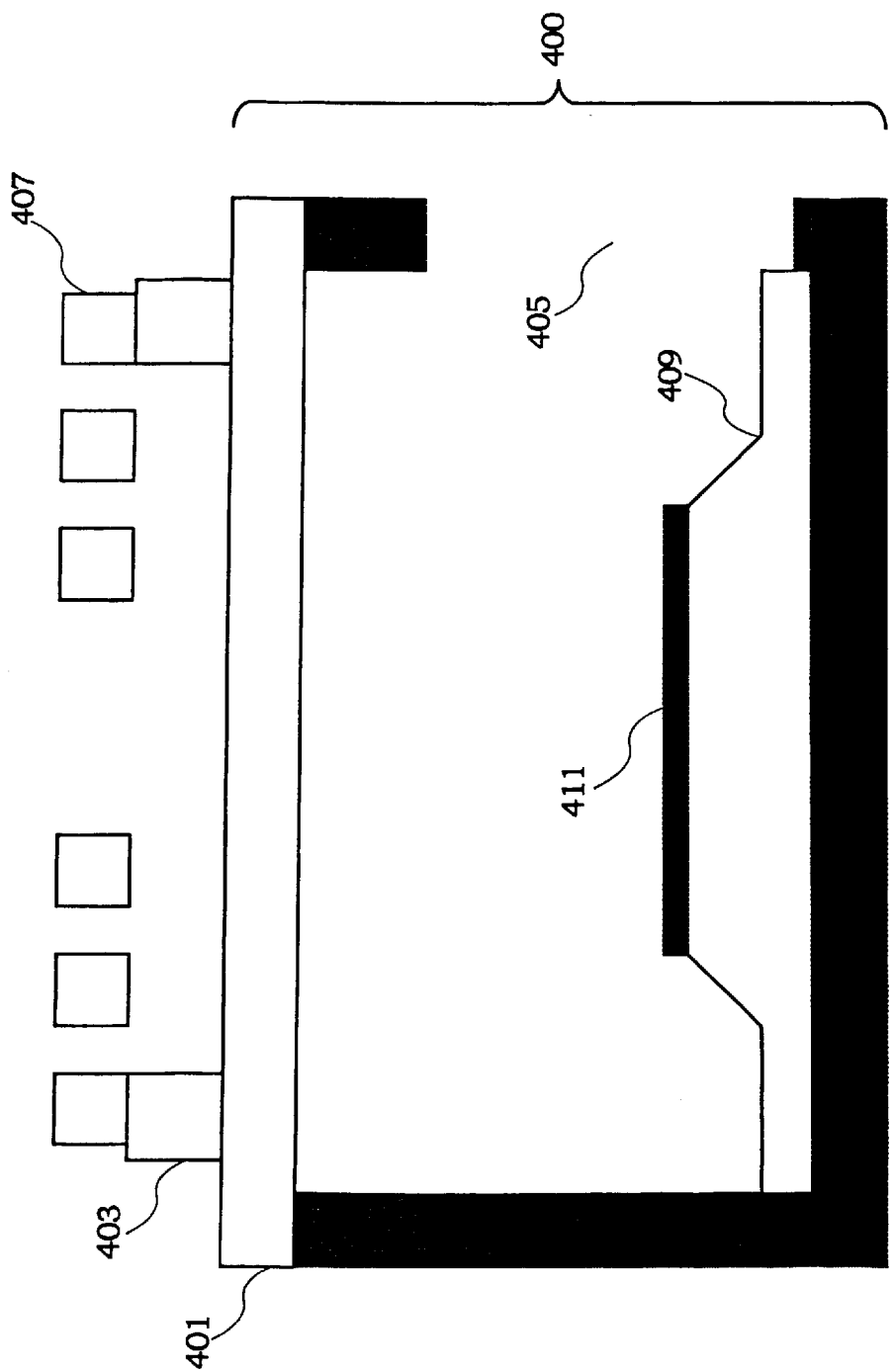
FIG. 1 is a simplified schematic cross-section showing a prior art inductively coupled plasma etching apparatus.

Several exemplary embodiments of the invention will now be described in detail with reference to the accompanying drawings. FIG. 1 is discussed above in the "Background of the Invention" section.

Figure 2:
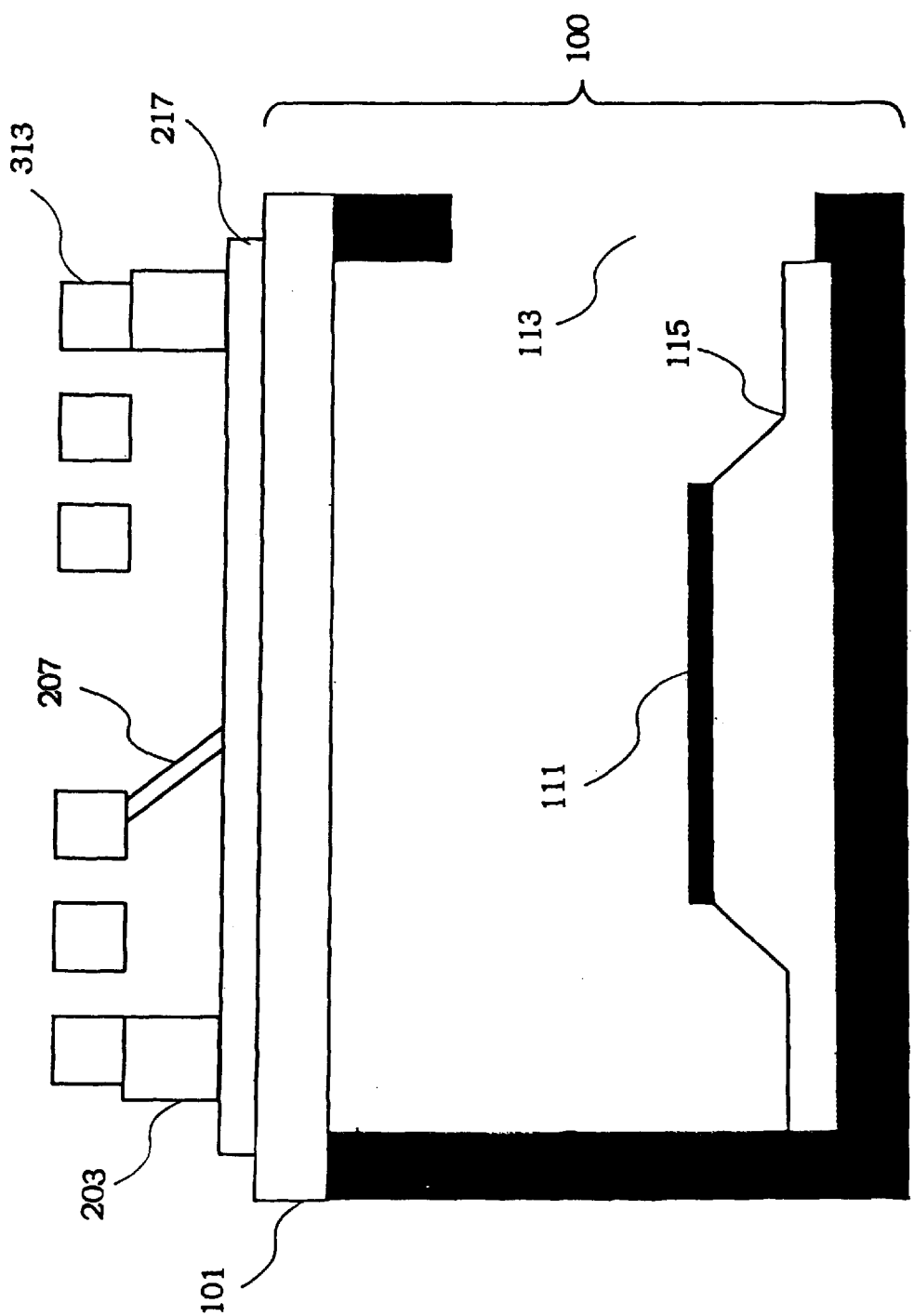
FIG. 2 is a simplified schematic cross-section showing an inductively coupled plasma etching apparatus in accordance with one embodiment of the present invention.

FIG. 2 is a simplified schematic cross-section showing an inductively coupled plasma etching apparatus in accordance with one embodiment of the present invention. As shown in FIG. 2, semiconductor wafer 111 is mounted on chuck 115 disposed in chamber 100, which is defined by walls of a housing, proximate to a lower wall of the housing. Coil 313 is supported on upper wall 101 of chamber 100 by spacers 203, which may be formed of an insulating material. In operation, a reactant gas is fed into chamber 100 through a gas lead-in port (not shown). High frequency power from a power supply (not shown) is applied to coil 313. The high frequency (RF) current passing through coil 313 induces an electromagnetic current in chamber 100, and the electromagnetic current acts on the reactant gas to generate a plasma.

The plasma contains various types of radicals and the chemical reaction of the positive/negative ions is used to etch semiconductor wafer 111 itself or an insulation film formed on the wafer. During the etching process, coil 313 carries out a function that corresponds to that of the primary coil of a transformer while the plasma in chamber 100 carries out a function that corresponds to that of the secondary coil of the transformer. If the reaction product generated by the etching process is volatile, then this reaction product is discarded via exhaust port 113.

Metal plate 217, which acts as a Faraday shield, is provided between coil 313 and chamber 100. In one embodiment, metal plate 217 is positioned in a spaced apart relationship between coil 313 and upper wall 101 of the housing and is substantially parallel to upper wall 101. The thickness of metal plate 217 is preferably between about 20 μm and about 10 mm, and more preferably between about 50 μm and about 5 mm. In one embodiment, metal plate 217 has a thickness of about 1.5 mm. Connector 207 electrically connects metal plate 217 to coil 313 at a predetermined position of the coil and functions to ensure that the in-plane RF voltage applied to metal plate 217 is uniform. Because the in-plane RF voltage applied to metal plate 217 is uniform, energy is uniformly added to the plasma in the vicinity of upper wall 101. As a result of this uniform energy distribution, the deposition and sputtering of the reaction product occurs uniformly so that undesirable accumulation of the reaction product on upper wall 101 does not occur.

In one embodiment, connector 207 electrically connects metal plate 217 to coil 313 at a position so that adequate $V_{pp}$ (peak-to-peak voltage) is applied on the metal plate. By uniformly applying $V_{pp}$ on metal plate 217, ions in the plasma are accelerated and uniformly bombard the vacuum side surface of a wall of the chamber of the inductively coupled plasma etching apparatus to prevent deposition of the reaction product thereon. In one embodiment, the inductively coupled plasma etching apparatus is a TCP 9400 PTX plasma etching apparatus, which is commercially available from Lam Research Corporation of Fremont, Calif. and the accelerated ions uniformly bombard the vacuum side surface of the TCP window to prevent deposition of the reaction product thereon. In an alternative embodiment, connector 207 electrically connects metal plate to a conductor extending from an impedance matching box to the coil.

Figure 3:
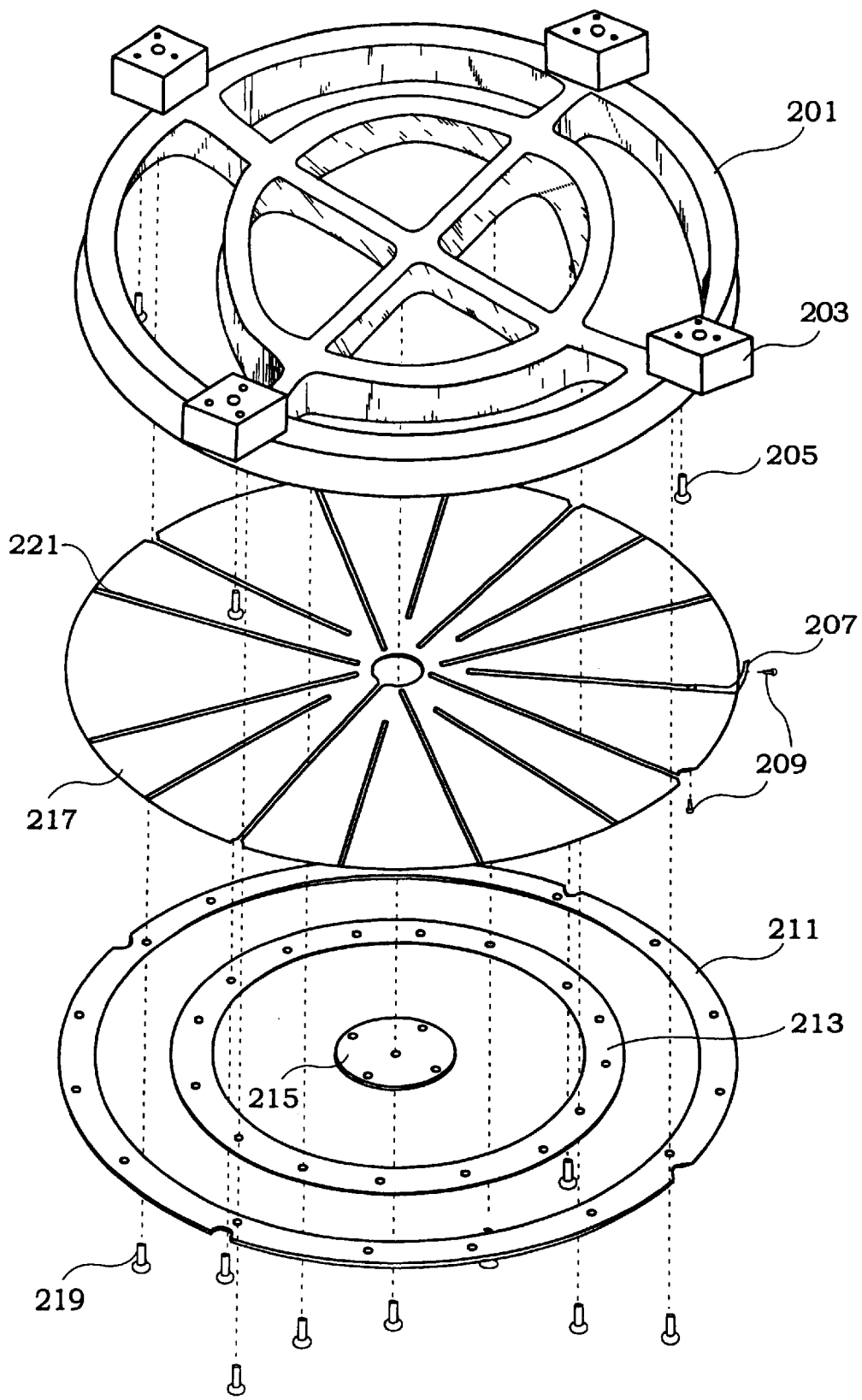
FIG. 3 is an exploded perspective view of a metal plate, which acts as a Faraday shield, and the components for holding the metal plate in place in accordance with one embodiment of the present invention.

FIG. 3 is an exploded perspective view of the metal plate, which acts as a Faraday shield, and the components for holding the metal plate in place in accordance with one embodiment of the invention. As shown in FIG. 3, metal plate 217 is secured to the underside of attachment frame 201, which is provided with attachment spacers 203 on a top side thereof, by screws 205. Attachment frame 201, attachment spacers 203, and screws 205 may be formed of any suitable insulating material.

Outer ring 211, inner ring 213, and center disk 215 are secured to attachment frame 201 by screws 219, which may be formed of any suitable insulating material. Outer ring 211, inner ring 213, and center disk 215 retain the shape of metal plate 217 during operation of the inductively coupled plasma etching apparatus. A plurality of radial slots 221 is formed in metal plate 217. Radial slots 221 extend transversely to the sections of coil 313 (see FIG. 4) to interrupt an internal induced power generated by electric current from flowing on metal plate 217, which is a conductor. This is necessary because electric current flowing on metal plate 217 causes coil 313 (see FIGS. 2 and 4) and chamber 100 (see FIG. 2) to be electrically shielded.

Figure 4:
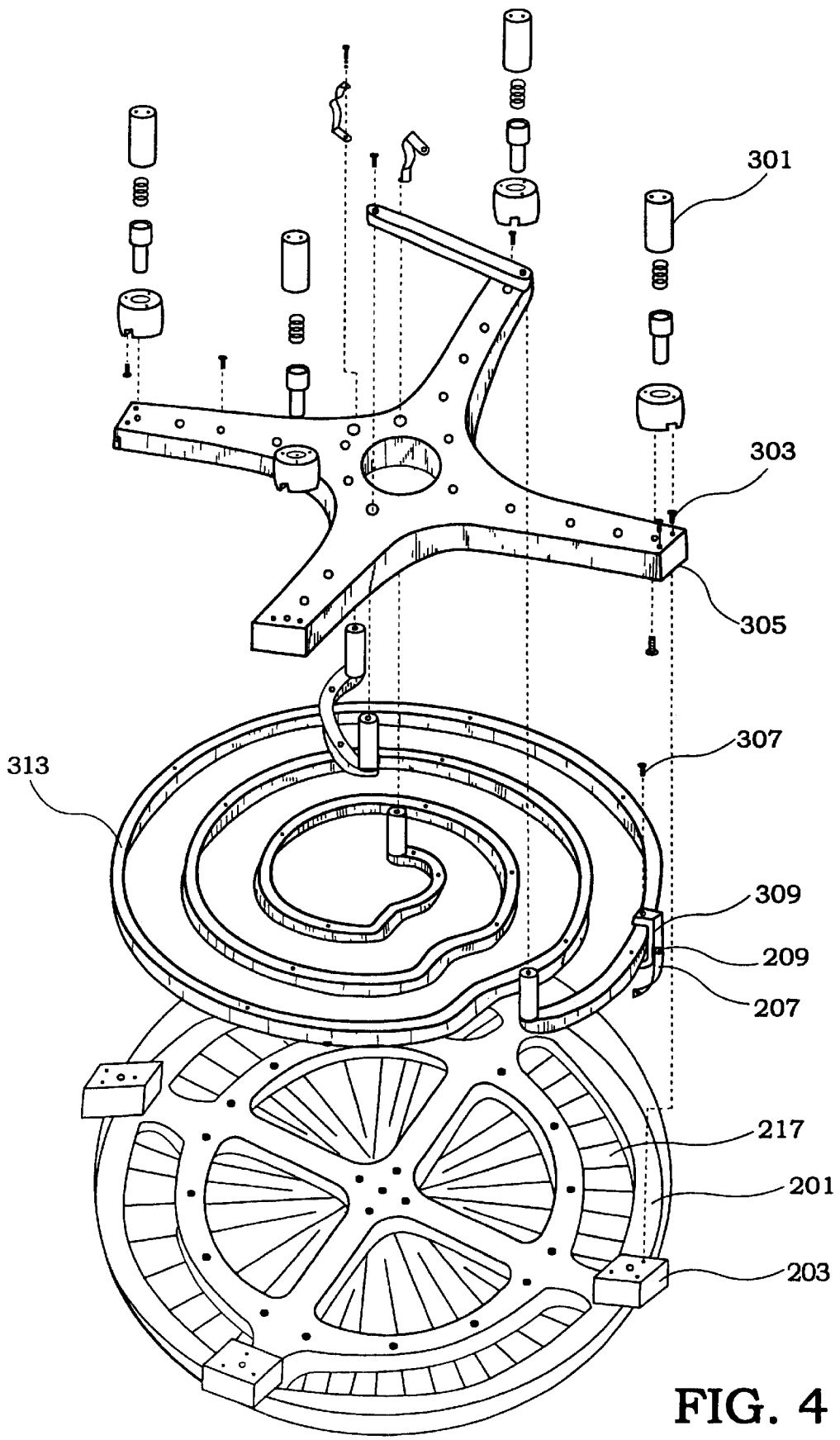
FIG. 4 is an exploded perspective view of a coil and the components for holding the coil in place in accordance with one embodiment of the present invention.

With continuing reference to FIG. 3, connector 207 electrically connects metal plate 217 and coil 313 (see FIGS. 2 and 4). Two metal screws 209 are used to make this connection, with one metal screw connecting metal plate 217 to connector 207 and the other metal screw connecting coil 313 (see FIGS. 2 and 4) to connector 207.

FIG. 4 is an exploded perspective view of the coil and the components for holding the coil in place in accordance with one embodiment of the invention. As shown in FIG. 4, attachment frame 201 and attachment spacers 203 are provided between metal plate 217 and coil 313. The four ends of cross-shaped coil mounting plate 305 are fixed by support spring housings 301 and metal screws 303 to retain the shape of coil 313. As shown in FIG. 4, coil 313 has three turns. Coil 313 must have at least one turn, but otherwise may have any suitable number of turns.

As discussed above in connection with the description of FIG. 3, connector 207 electrically connects metal plate 217 to coil 313. As shown in FIG. 4, a U-shaped spacer 309 positions coil mounting plate 305, coil 313, and metal plate 217. U-shaped spacer 309 is connected to coil 313 by metal screw 307. One metal screw 209 electrically connects connector 207 to coil 313 through U-shaped spacer 309 and another metal screw 209 electrically connects connector 207 to metal plate 217 (see FIG. 3).

The present invention also provides a method for controlling an inner surface of a wall defining a chamber in which a plasma is generated in an inductively coupled plasma etching apparatus. In this method, a metal plate is provided between a coil for receiving high frequency (RF) power and the plasma generated in the chamber such that the metal plate does not contact the coil. The metal plate has a plurality of metal slits formed therein that extend transversely to the coil and is electrically connected to the coil, as described above. A plasma etching operation is conducted in the inductively coupled plasma etching apparatus. During the plasma etching operation, the deposition of a reaction product on an inner surface of a wall positioned between the metal plate and the plasma and the sputtering of the reaction product from the inner surface of the wall are substantially uniform so that an amount of the reaction product sufficient to disable the plasma etching operation does not accumulate on the inner surface of the wall. In one embodiment, the wall positioned between the metal plate and the plasma is an upper wall of the chamber.

The inductively coupled plasma etching apparatus of the present invention is well suited for plasma etching of recently developed device materials (e.g., platinum, ruthenium, and the like) that generate nonvolatile, electrically conductive reaction products (e.g., $RuO_2$). It will be apparent to those skilled in the art that the inductively coupled plasma etching apparatus of the present invention also may be used to plasma etch standard materials such as metal and polysilicon. In the plasma etching of metal and polysilicon, $V_{pp}$ is adjusted to realize uniform and minimum deposition. In this manner, the mean wafer between clean (MWBC) and the lifetime of the TCP window may be improved.

In summary, the present invention provides an inductively coupled plasma etching apparatus and a method for controlling an inner surface of a wall defining a chamber in which a plasma is generated. The invention has been described herein in terms of several preferred embodiments. Other embodiments of the invention will be apparent to those skilled in the art from consideration of the specification and practice of the invention. For example, the shape of the metal plate, which acts as a Faraday shield, and the positional relationship between the metal plate and the chamber may be varied in accordance with the inductively coupled plasma etching apparatus adopting the present invention. The embodiments and preferred features described above should be considered exemplary, with the scope of the invention being defined by the appended claims and their equivalents.

What is claimed is:

1. An inductively coupled plasma etching apparatus, comprising:

a chamber for generating a plasma therein, the chamber being defined by walls of a housing;

a coil for receiving high frequency (RF) power disposed adjacent to and outside of one of the walls of the housing;

a metal plate disposed adjacent to and outside of the wall of the housing that the coil is disposed adjacent to, the metal plate being positioned in a spaced apart relationship between the coil and the wall of the housing and having radial slits formed therein that extend transversely to the coil, the metal plate being secured to an underside of an attachment frame; and a connector electrically connecting the metal plate to the coil.

2. The apparatus of claim 1, wherein a chuck for holding a semiconductor wafer is disposed proximate to a lower wall of the housing, and the metal plate is disposed along a surface of an upper wall of the housing.

3. The apparatus of claim 1, wherein the metal plate is substantially parallel to the upper wall of the housing.

4. The apparatus of claim 1, wherein a thickness of the metal plate is in a range from about 20 $\mu$m to about 10 mm.

5. The apparatus of claim 1, wherein a thickness of the metal plate is in a range from about 50 $\mu$m to about 5 mm.

6. The apparatus of claim 1, wherein a thickness of the metal plate is about 1.5 mm.

7. The apparatus of claim 1, wherein the connector electrically connects the metal plate to a predetermined position of the coil so that accumulation of a reaction product on an upper wall of the housing is substantially eliminated.

8. An inductively coupled plasma etching apparatus, comprising:

a chamber for generating a plasma therein, the chamber being defined by walls of a housing, the walls including a lower wall having a chuck for holding a semiconductor wafer disposed proximate thereto and an upper wall disposed above the lower wall;

a coil for receiving high frequency (RF) power disposed adjacent to and outside of the upper wall of the housing;

a metal plate disposed adjacent to and outside of the upper wall of the housing, the metal plate being positioned in a spaced apart relationship between the coil and the upper wall of the housing and having radial slits formed therein that extend transversely to the coil, the metal plate being secured to an underside of an attachment frame, the metal plate further having a thickness in a range from about 20 $\mu$m to about 10 mm; and a connector electrically connecting the metal plate to the coil.

9. The apparatus of claim 8, wherein the metal plate is substantially parallel to the upper wall of the housing.

10. The apparatus of claim 8, wherein a thickness of the metal plate is in a range from about 50 $\mu$m to about 5 mm.

11. The apparatus of claim 8, wherein a thickness of the metal plate is about 1.5 mm.

12. The apparatus of claim 8, wherein the connector electrically connects the metal plate to one of a predetermined position of the coil and a conductor extending from an impedance matching box to the coil.

13. The apparatus of claim 8, wherein the metal plate is secured to the underside of the attachment frame by an outer ring, an inner ring, and a center disk.

14. The apparatus of claim 13, wherein the attachment frame includes attachment spacers on a top side thereof, and the attachment frame and the attachment spacers are comprised of an insulating material.

15. The apparatus of claim 14, wherein the coil is positioned between the top side of the attachment frame and a coil mounting plate, and the coil mounting plate is secured to the attachment spacers.

16. The apparatus of claim 15, wherein a U-shaped spacer positions the coil mounting plate, the coil, and the metal plate, and the connector electrically connects the metal plate to the coil through the U-shaped spacer.

* * * * *